(12) United States Patent
Tseng et al.

(10) Patent No.: US 12,469,834 B2
(45) Date of Patent: Nov. 11, 2025

(54) SEMICONDUCTOR PACKAGE AND SEMICONDUCTOR DEVICE

(71) Applicant: Taiwan Semiconductor Manufacturing Company, Ltd., Hsinchu (TW)

(72) Inventors: Shu-Jung Tseng, Taichung County (TW); Hui-Chang Yu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 61 days.

(21) Appl. No.: 17/458,573

(22) Filed: Aug. 27, 2021

(65) Prior Publication Data

US 2023/0060520 A1    Mar. 2, 2023

(51) Int. Cl.
| | |
|---|---|
| *H01L 23/498* | (2006.01) |
| *H01L 23/00* | (2006.01) |
| *H01L 25/18* | (2023.01) |
| *H10D 1/68* | (2025.01) |
| *H10D 84/00* | (2025.01) |

(52) U.S. Cl.
CPC ........ *H01L 25/18* (2013.01); *H01L 23/49816* (2013.01); *H01L 23/49822* (2013.01); *H01L 24/08* (2013.01); *H10D 1/716* (2025.01); *H10D 84/206* (2025.01); *H01L 2224/08145* (2013.01)

(58) Field of Classification Search
CPC ..... H01L 2224/08145; H01L 23/49816; H01L 23/49822; H01L 23/538; H01L 24/08; H01L 25/0655; H01L 25/165; H01L 25/18; H01L 27/101; H01L 28/90; H01L 29/945

See application file for complete search history.

(56) References Cited

U.S. PATENT DOCUMENTS

| | | | | |
|---|---|---|---|---|
| 2003/0082875 | A1* | 5/2003 | Lee | H01L 21/84 438/243 |
| 2007/0290770 | A1* | 12/2007 | Otsuka | H03H 9/0057 333/193 |
| 2010/0019348 | A1 | 1/2010 | Nagai | |
| 2010/0200949 | A1* | 8/2010 | Booth, Jr. | H01L 29/945 257/532 |

(Continued)

FOREIGN PATENT DOCUMENTS

| | | | | |
|---|---|---|---|---|
| CN | 102956616 A | * | 3/2013 | ....... H01L 21/76898 |
| CN | 110634750 A | * | 12/2019 | ........... H01L 21/563 |

(Continued)

OTHER PUBLICATIONS

"Office Action of Taiwan Counterpart Application", issued on Jul. 20, 2022, p. 1-p. 4.

*Primary Examiner* — Telly D Green
(74) *Attorney, Agent, or Firm* — JCIPRNET (57) ABSTRACT

Disclosed are semiconductor packages and semiconductor devices. In one embodiment, a semiconductor package includes a package, a first integrated passive device, and a second integrated passive device. The first integrated passive device is disposed below the package. The second integrated passive device is disposed between the package and the first integrated passive device. The first integrated passive device is electrically connected to the package through the second integrated passive device.

20 Claims, 3 Drawing Sheets

(56) References Cited

U.S. PATENT DOCUMENTS

| | | | |
|---|---|---|---|
| 2012/0146185 A1 | 6/2012 | Nagai | |
| 2016/0233196 A1* | 8/2016 | Kim | H01L 25/105 |
| 2018/0005984 A1* | 1/2018 | Yu | H01L 25/0655 |
| 2018/0130781 A1* | 5/2018 | Kang | H01L 25/18 |
| 2018/0197837 A1* | 7/2018 | Yu | H01L 21/31053 |
| 2019/0393153 A1* | 12/2019 | Wang | H01L 21/76898 |
| 2020/0083187 A1* | 3/2020 | Wu | H01L 21/486 |
| 2020/0091063 A1* | 3/2020 | Chen | H01L 25/0657 |
| 2020/0135653 A1* | 4/2020 | Tsai | H01L 23/3142 |
| 2020/0402965 A1* | 12/2020 | Ng | H01L 25/105 |
| 2022/0108968 A1* | 4/2022 | Kim | H01L 25/18 |
| 2022/0262751 A1* | 8/2022 | Zhang | H01L 25/0652 |

FOREIGN PATENT DOCUMENTS

| | | | | |
|---|---|---|---|---|
| CN | 107301981 B | * | 7/2020 | H01L 21/31053 |
| CN | 107768351 B | * | 4/2021 | H01L 21/50 |
| EP | 3621119 A1 | * | 3/2020 | H01L 21/3065 |
| EP | 3817050 A2 | * | 5/2021 | H01L 27/10805 |
| TW | 201532247 | | 8/2015 | |
| TW | 202119594 | | 5/2021 | |

\* cited by examiner

SEMICONDUCTOR PACKAGE AND SEMICONDUCTOR DEVICE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (PoP) technology. In a PoP package, a top semiconductor package is stacked on top of a bottom semiconductor package to allow high level of integration and component density. This high level of integration from PoP technology enables production of semiconductor devices with enhanced functionalities and small footprints on the printed circuit board (PCB).

Integrated passive devices (IPDs) and technologies are gaining popularity recently. A wide variety of passive devices, such as baluns, couplers, splitters, filters and diplexers can be integrated in an IPD device. By replacing traditional discrete surface mount devices (SMDs) with IPDs, significant savings of PCB area can be achieved. At the same time, IPDs provide significant cost reductions and performance improvements over traditional SMDs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, it will be understood that when an element is referred to as being "connected to" or "coupled to" another element, it may be directly connected to or coupled to the other element, or one or more intervening elements may be present. Further, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
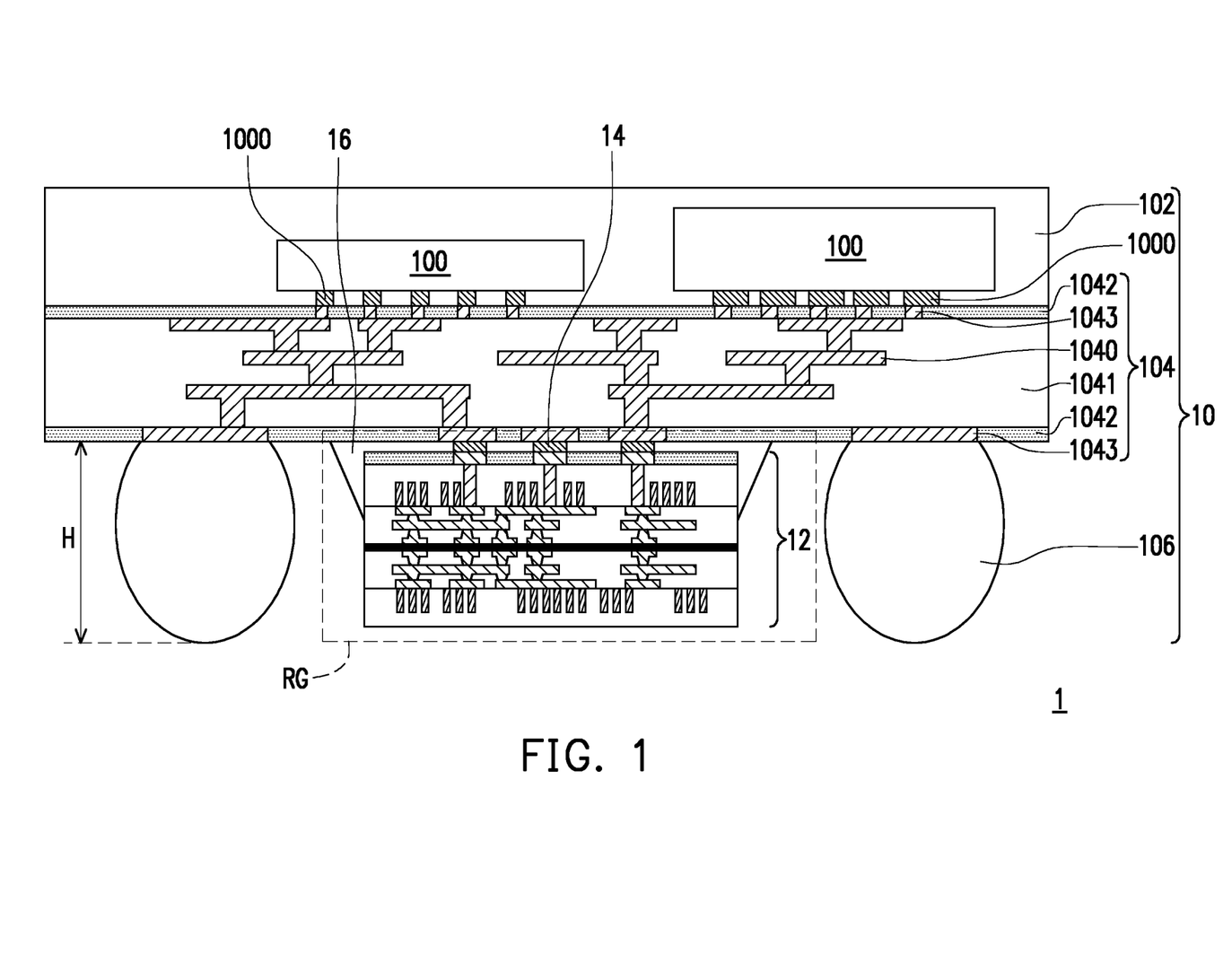
FIG. 1 illustrates a partial cross-sectional view of an exemplary semiconductor package, in accordance with some embodiments of the present disclosure.
Figure 2:
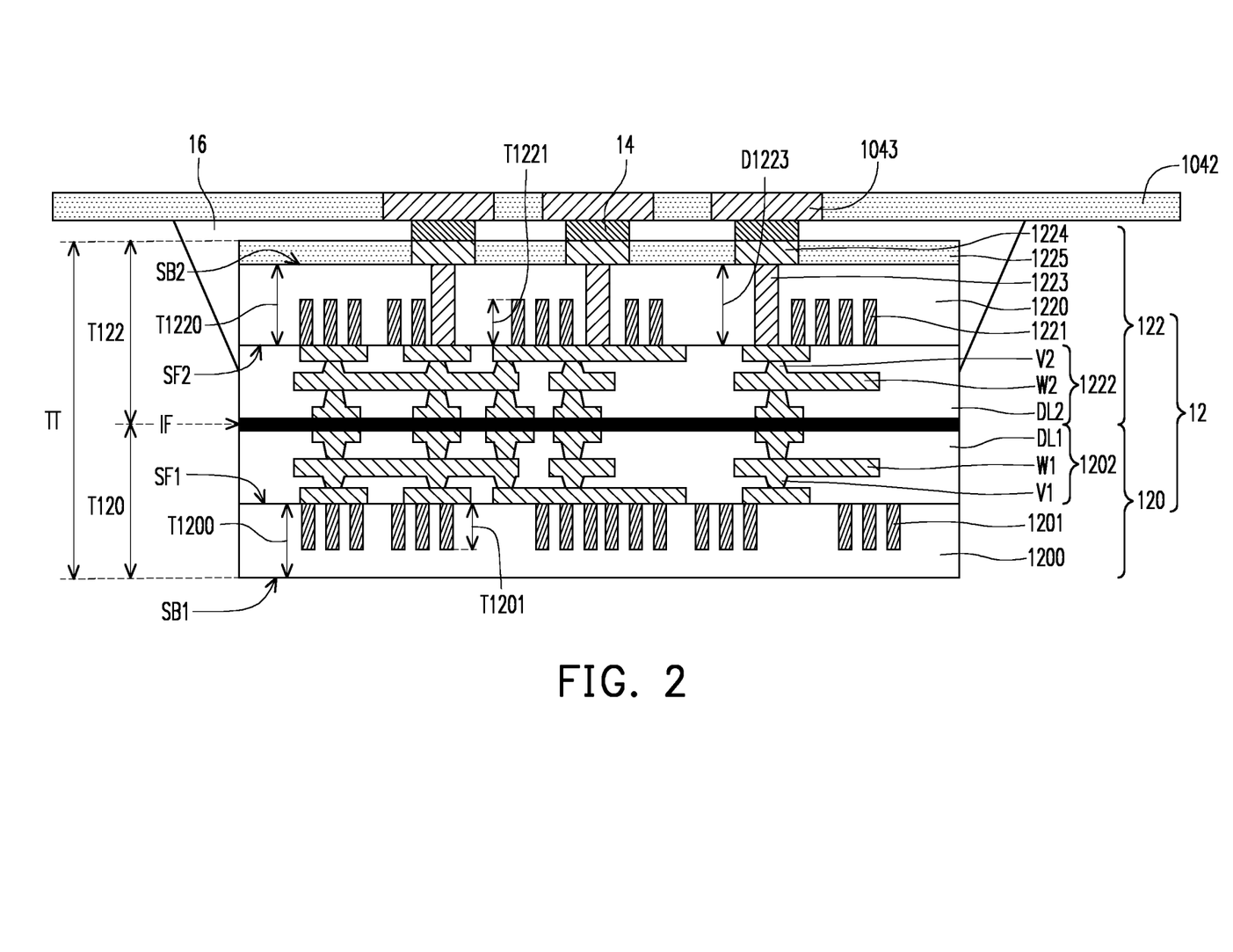
FIG. 2 illustrates an enlarged view of a region RG in FIG. 1.
Figure 3:
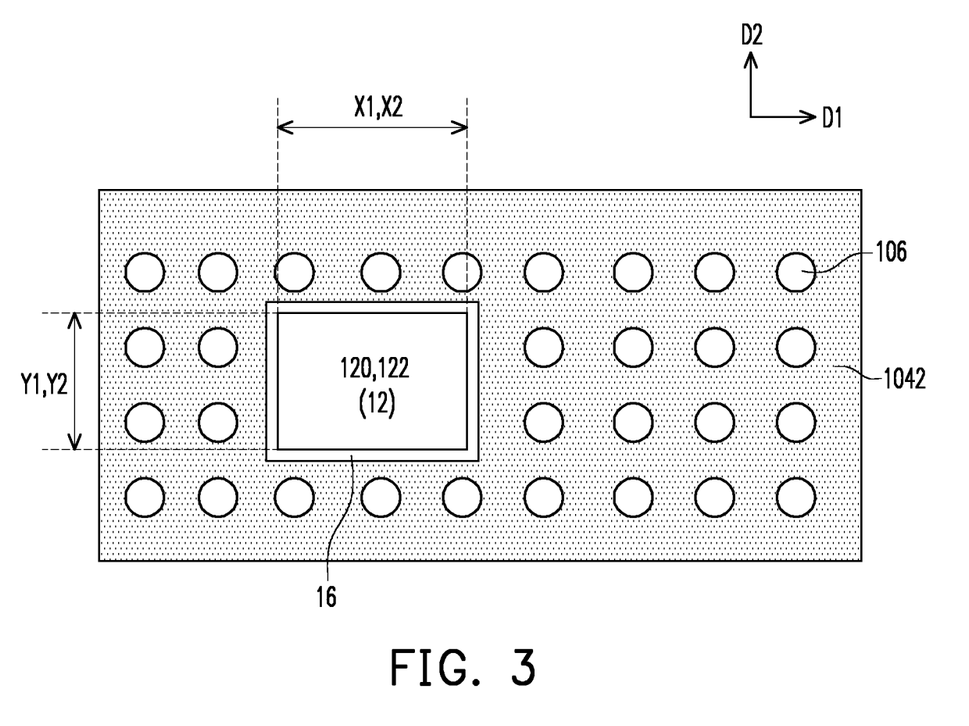
FIG. 3 illustrates a partial bottom view of an exemplary semiconductor package, in accordance with some embodiments of the present disclosure.

FIG. 1 illustrates a partial cross-sectional view of an exemplary semiconductor package 1, in accordance with some embodiments of the present disclosure. FIG. 2 illustrates an enlarged view of a region RG in FIG. 1. FIG. 3 illustrates a partial bottom view of the exemplary semiconductor package 1, in accordance with some embodiments of the present disclosure.

Referring to FIG. 1 to FIG. 3, the semiconductor package 1 may be a PoP package that includes a package 10 and a bottom package (e.g., a semiconductor device 12), in accordance with some embodiments of the present disclosure.

In some embodiments, as illustrated in FIG. 1, the package 10 includes a plurality of semiconductor dies or integrated circuit dies 100, an insulating encapsulation (e.g., a molding compound) 110, a redistribution layer (RDL) 120, and a plurality of connectors 106. However, the package 10 shown in FIG. 1 is merely an example, and is not intended to limit the present disclosure. Accordingly, it is understood that additional layers or elements may be provided in or coupled to the package 10 of FIG. 1, and that some other layers or elements may merely be briefly described herein.

The integrated circuit dies 100 are arranged, for example, in array. Only two integrated circuit dies 100 are shown in FIG. 1, however, the number of integrated circuit dies 100 shown in FIG. 1 is merely an example, and is not intended to limit the present disclosure. Accordingly, it is understood that dozens, hundreds, or more integrated circuit dies 100 may be disposed on the redistribution layer 104 and packaged simultaneously.

In some embodiments, the integrated circuit dies 100 include memory, flash, power chip, power module, converter, sensor, logic die, interposer and so on to provide a desired functionality. In some embodiments, the integrated circuit dies 100 includes a semiconductor substrate (not shown), an interconnection structure (not shown) formed on the semiconductor substrate, a passivation layer (not shown) formed on the interconnection structure, a plurality of bump pads (not shown) formed on the passivation layer and electrically connected to the interconnection structure, a post passivation layer (not shown) covering the passivation layer and the bump pads, and a plurality of conductive pillars or conductive bumps 1000 formed on the post passivation layer and electrically connected to the bump pads. It is noted that throughout the specification and the claims of the disclosure, certain terms are used to refer to specific components. Those skilled in the art should understand that manufacturers may probably use different names to refer to the same components. For example, the bump pads may also refer to as contact pads, conductive pads or the like. This specification is not intended to distinguish between components that have the same function but different names.

In some embodiments, the semiconductor substrate is a silicon substrate including active components (e.g., transistors or the like) and passive components (e.g., resistors, capacitors, inductors or the like) formed therein. In some embodiments, the interconnection structure includes a plurality of interconnect wiring layers and a plurality of dielectric layers stacked alternately. In some embodiments, the passivation layer covers the interconnection structure and includes a plurality of contact openings such that the topmost interconnect wiring layers of the interconnection structure are exposed through the contact openings of the passivation layer. In some embodiments, the passivation layer is a silicon oxide layer, a silicon nitride layer, a silicon oxynitride layer or a dielectric layer formed by other suitable dielectric materials. In some embodiments, the bump pads are formed in the contact openings of the passivation layer and electrically connected to the topmost interconnect wiring layers of the interconnection structure through the contact opening of the passivation layer. In some embodiments, the bump pads are aluminum pads, copper pads or other suitable metal pads. In some embodiments, the post passivation layer includes a plurality of contact openings such that the bump pads are partially exposed by the contact openings of the post passivation layer. In some embodiments, the post passivation layer is a polyimide (PI) layer, a polybenzoxazole (PBO) layer, or a dielectric layer formed by other suitable polymers. In some embodiments, the integrated circuit dies 100 are electrically connected to the redistribution layer 104 through the plurality of conductive pillars or conductive bumps 1000. In some embodiments, the plurality of conductive pillars or conductive bumps 1000 are plated copper pillars or bumps or other suitable conductive pillars or bumps.

In some embodiments, as illustrated in FIG. 1, the insulating encapsulation 102 encapsulates the integrated circuit dies 100 to protect the integrated circuit dies 100 from outside environments such as moisture and physical impact. In some embodiments, the insulating encapsulation 102 includes an epoxy, an organic polymer, a polymer with or without a silica-based or glass filler added, or other materials, as examples. In some embodiments, the insulating encapsulation 102 is molded using, for example, compressive molding, transfer molding, or other methods. In some embodiments, the insulating encapsulation 102 is formed by a molding process (e.g., over-molding process) followed by a grinding process (e.g., mechanical grinding process and/or chemical mechanical polishing process) to partially remove the molding compound of the insulating encapsulation, but other methods for forming the insulating encapsulation 102 are within the contemplated scope of the disclosure.

In some embodiments, as illustrated in FIG. 1, the redistribution layer 104 is disposed on active surfaces of the integrated circuit dies 100 and a bottom surface of the insulating encapsulation 102. In some embodiments, the redistribution layer 104 includes a plurality of conductive layers 1040 and a plurality of dielectric layers 1041 stacked alternately. In some embodiments, the conductive layers 1040 include a plurality of wires and a plurality of vias formed of one or more metal materials (e.g., copper (Cu), gold (Au), alloys thereof and the like). In some embodiments, the dielectric layers 1041 are formed of any suitable dielectric materials such as silicon oxide, silicon nitride, silicon oxynitride, a low k dielectric, some other suitable dielectric(s), polybenzoxazole (PBO), polyimide, a polyimide derivative, or any combination of the foregoing.

In some embodiments, the redistribution layer 104 further includes isolation layers 1042 respectively disposed on the uppermost dielectric layers 1041 and disposed under the lowermost dielectric layers 1041. In some embodiments, the isolation layers 1042 are formed of any suitable dielectric materials such as solder mask or polyimide. However, other suitable materials are within the contemplated scope of the disclosure. In some embodiments, the isolation layers 1042 includes a plurality of contact openings such that contact pads (e.g., under bump metallurgy (UBM)) 1043 of the redistribution layer 104 are partially exposed by the contact openings of the isolation layers 1042. In some embodiments, the contact pads 1043 include a conductive material such as copper, aluminum, other metals, or alloys or multiple layers thereof, as examples. However, other suitable materials are within the contemplated scope of the disclosure.

In some embodiments, the contact pads 1043 on the uppermost layer of the redistribution layer 104 are in contact with the conductive bumps 1000 so that the integrated circuit dies 100 is electrically connected to the redistribution layer 104. In some embodiments, the contact pads 1043 on the lowermost layer of the redistribution layer 104 are in contact with the connectors 106. In some embodiments, the connectors 106 include micro bumps, such as ball grid array (BGA), but other types of the connectors 106 are within the contemplated scope of the disclosure. In some embodiments, the connectors 106 include solder balls, or other types of electrical connectors, such as controlled collapse chip connection (C4) bumps, or pillars, and may include conductive materials such as Cu, Sn, Ag, Pb, or the like. In some embodiments, the connectors 106 are not included in the package 10.

In some embodiments, as illustrated in FIG. 1, the semiconductor device 12 is disposed below the package 10 and electrically connected to the package 10. Only one semiconductor device 12 are shown in FIG. 1 to FIG. 3, however, the number of semiconductor device 12 shown in FIG. 1 to FIG. 3 is merely an example, and is not intended to limit the present disclosure. Accordingly, it is understood that any number of semiconductor device 12 may be disposed below and electrically connected to the package 10.

In some embodiments, the semiconductor device 12 is electrically connected to the package 10 through a plurality of micro bumps 14. However, other suitable electrical connection method between the package 10 and the semiconductor device 12 are within the contemplated scope of the disclosure. In some embodiments, the semiconductor package 1 further includes an underfill 16 disposed between the semiconductor device 12 and the package 10 to protect the micro bumps 14 against thermal or physical stresses and secure the electrical connection between the package 10 and the semiconductor device 12.

In some embodiments, the underfill 16 is formed by capillary underfill filling (CUF). A dispenser (not shown) may apply a filling material (not shown) along the perimeter of the semiconductor device 12. In some embodiments, a heating process is performed to let the filling material penetrate in the interstices formed by the micro bumps 14 between the package 10 and the semiconductor device 12 by capillarity. In some embodiments, a curing process is performed to consolidate the underfill 16. In some embodiments, the underfill 16 is formed by molded underfill (MUF).

In some embodiments, as illustrated in FIG. 1 and FIG. 2, the semiconductor device 12 includes a plurality of integrated passive devices. An integrated passive device is a collection of one or more passive devices integrated on a semiconductor substrate. Passive devices may include, for example, capacitors, resistors, inductors, and so on. Integrated passive devices are formed, for example, using semiconductor manufacturing processes and are packaged as integrated circuits (ICs). This leads to reduced size, reduced cost, and increased functional density compared to discrete passive devices.

Only two integrated passive devices (e.g., a first integrated passive device 120 and a second integrated passive device 122) are shown in FIG. 1, however, the number of integrated passive devices in the semiconductor device 12 is merely an example, and is not intended to limit the present disclosure. Accordingly, it is understood that any number of integrated passive devices in the semiconductor device 12 are within the contemplated scope of the disclosure. In some embodiments, the first integrated passive device 120 and the second integrated passive device 12 are both integrated capacitor devices. Alternatively, the first integrated passive device 120 and/or the second integrated passive device 12 may be other types of passive device(s).

In some embodiments, as illustrated in FIG. 1 to FIG. 3, the first integrated passive device 120 and the second integrated passive device 122 can be stacked below the package 10, and the second integrated passive device 122 can be disposed between the package 10 and the first integrated passive device 120. In these embodiments, the underfill 16 is disposed between the second integrated passive device 122 and the package 10, and the semiconductor device 12 (including the first integrated passive device 120 and the second integrated passive device 122) is surrounded by the plurality of connectors 106. In some embodiments, each of the plurality of connectors 106 has a height H larger than a total thickness TT of the semiconductor device 12. For example, in the embodiments in which the semiconductor device 12 includes the first integrated passive device 120 and the second integrated passive device 122, as shown in FIG. 1, the thickness TT of the semiconductor device 12 equals to a sum of a thickness T120 of the first integrated passive device 120 and a thickness T122 of the second integrated passive device 122. In other words, TT=T120+T122. In some embodiments, each of the plurality of connectors 106 has a height H ranging from 50 μm to 300 μm, but not limited thereto.

In some embodiments, as illustrated in FIG. 2, the first integrated passive device 120 is an integrated capacitor device (also referred to as "the first integrated capacitor device"). The first integrated passive device 120 includes a first substrate 1200, a plurality of first deep trench capacitors 1201, and a first redistribution layer 1202, in accordance with some embodiments of the present disclosure. In some alternative embodiments, other layers or elements may be provided in the first integrated passive device 120.

The first substrate 1200 is, for example, a bulk monocrystalline silicon substrate or other suitable semiconductor substrate(s). The plurality of first deep trench capacitors 1201 are disposed in the first substrate 1200. Specifically, the first deep trench capacitors 1201 may include trench segments spread across the first substrate 1200. Further, each of the trench segments extends or protrudes from a front side SF1 of the first substrate 1200 towards a back side SB1 of the first substrate 1200. In some embodiments, each of the trench segments (or each of the plurality of first deep trench capacitors 1201) has a thickness T1201 larger than 2 μm and less than a thickness T1200 of the first substrate 1200. The trench segments individually form two-dimensional (2D) trench capacitors. A 2D trench capacitor is a trench capacitor limited to a single device layer (e.g., a single IPD), whereas a 3D trench capacitor is a trench capacitor spanning multiple device layers (e.g., multiple IPDs).

The first redistribution layer 1202 is disposed on the first substrate 1200 and electrically connected to the plurality of first deep trench capacitors 1201. In some embodiments, the first redistribution layer 1202 includes a plurality of dielectric layers DL1, a plurality of wires W1, and a plurality of vias V1. The plurality of wires W1 and the plurality of vias V1 are alternatingly stacked in the dielectric layers DL1 to form conductive paths from the trench segments to the interface IF between the first integrated passive device 120 and the second integrated passive device 122. The dielectric layers DL1 may include, for example, silicon oxide, silicon nitride, silicon oxynitride, a low k dielectric, some other suitable dielectric(s), or any combination of the foregoing. The wires W1 and the vias V1 may include, for example, metal and/or some other suitable conductive material(s).

In some embodiments, as illustrated in FIG. 2, the second integrated passive device 122 is an integrated capacitor device (also referred to as "the second integrated capacitor device"). The second integrated passive device 122 includes a second substrate 1220, a plurality of second deep trench capacitors 1221, a plurality of through vias 1223 (may also referred to as "through substrate vias (TSVs)"), a second redistribution layer 1222, and a plurality of contact pads 1224, in accordance with some embodiments of the present disclosure. However, other layers or elements may be provided in the second integrated passive device 122 in accordance with some alternative embodiments of the present disclosure.

The second substrate 1220 is, for example, a bulk monocrystalline silicon substrate or other suitable semiconductor substrate(s). The plurality of second deep trench capacitors 1221 and the plurality of through vias 1223 are disposed in the second substrate 1220. Specifically, the second deep trench capacitors 1221 may include trench segments spread across the second substrate 1220. Further, each of the trench segments extends or protrudes from a front side SF2 of the second substrate 1220 towards a back side SB2 of the second substrate 1220. In some embodiments, each of the trench segments (or each of the plurality of second deep trench capacitors 1221) may have a thickness T1221 larger than 2 μm and less than a thickness T1220 of the second substrate 1220. In some embodiments, at least one of or each of the plurality of through vias 1223 may be located between two adjacent second deep trench capacitors 1221. In other words, the through vias 1223 may be located between the second deep trench capacitors 1221 instead of on a side of the second deep trench capacitors 1221. However, other disposition relationship between the plurality of second deep trench capacitors 1221 and the plurality of through vias 1223 are within the contemplated scope of the disclosure.

Each of the through vias 1223 extends or protrudes from the front side SF2 of the second substrate 1220 to the back side SB2 of the second substrate 1220, and each of the through vias 1223 may have a depth D1223 equal to or approximate to the thickness T1220 of the second substrate 1220. In some embodiments, each of the plurality of through vias 1223 has a depth D1223 ranging from 5 μm to 100 μm (i.e., 5 μm≤D1223≤100 μm), but not limited thereto. In some embodiments, a process for forming the through vias 1223 may, for example, includes: 1) forming via openings in the second substrate 1220; 2) depositing a conductive layer over the second substrate 1220 and further filling the via openings; and 3) performing a planarization into the conductive layer from the back side 124 of the first substrate 110a to expose the back side SB2 of the second substrate 1220. The planarization may, for example, be or include a CMP or some other suitable planarization. Other processes for forming the through vias 1223 is/are, however, amenable.

The second redistribution layer 1222 is disposed between the first redistribution layer 1202 and the second substrate 1220 and electrically connected to the first redistribution layer 1202, the plurality of second deep trench capacitors 1221, and the plurality of through vias 1223. In some embodiments, the second redistribution layer 1222 includes a plurality of dielectric layers DL2, a plurality of wires W2, and a plurality of vias V2. The plurality of wires W2 and the plurality of vias V2 are alternatingly stacked in the dielectric layers DL2 to form conductive paths from the trench segments to the interface IF between the first integrated passive device 120 and the second integrated passive device 122. The dielectric layers DL2 may include, for example, silicon oxide, silicon nitride, silicon oxynitride, a low k dielectric, some other suitable dielectric(s), or any combination of the foregoing. The wires W2 and the vias V2 may include, for example, metal and/or some other suitable conductive material(s).

In some embodiments, the second redistribution layer 1222 is fusion bonded to the first redistribution layer 1202 so that the second redistribution layer 1222 is electrically connected in parallel with the first integrated capacitor device 1202. By using fusion bonding in place of hybrid bonding, process difficulties with the hybrid bonding may be mitigated. The hybrid bonding may be more difficult to implement than the fusion bonding because it depends upon alignment between the wires at the interface IF to electrically couple the first integrated passive device 120 and the second integrated passive device 122 together, whereas the fusion bonding does not. However, in some alternative embodiments, hybrid bonding or other suitable bonding method(s) are within the contemplated scope of the disclosure.

The integrated passive devices (IPDs) may be used for, among other things, mobile devices and access processors. Mobile devices and access processors continuously seek to scale down. As such, mobile devices and access processors continuously seek smaller and smaller integrated passive devices. To decrease the size of the integrated passive device, the size of the trench capacitor may be decreased by increasing the capacitance density of the trench capacitor. The capacitance density corresponds to capacitance per unit area in a two-dimensional (2D) projection of the trench capacitor onto a horizontal or XY plane (e.g., a footprint of the trench capacitor). Capacitance density may be increased by increasing the depth of the trench segment (e.g., how deep the trench segment extends into the substrate) in a thickness direction or Z dimension. However, semiconductor manufacturing processes used to form the integrated passive device may limit the depth and may hence limit the capacitance density.

Increasing the depth of the trench segment increases an aspect ratio of the trench segment (e.g., a ratio of height to width) and hence increases an aspect ratio of a trench within which the trench segment is formed. At high aspect ratios, material may cluster around top corners of the trench during deposition of layers from which the trench segment is formed. This phenomenon may be known as trench necking. The clustering may pinch off a top of the trench before the deposition completes. As such, a void may form in the trench. Further, some layers from which the trench segment is formed may be restricted to a top of the trench, which may decrease electrode surface area and may hence decrease the capacitor density.

In the embodiments of the disclosure, the 2D trench capacitors are electrically connected in parallel by the plurality of wires W1 and W2 and the plurality of vias V1 and V2, such that a capacitance of the 3D trench capacitor (i.e., the capacitance of the semiconductor device 12) is a sum of the capacitances of the 2D trench capacitors. Because the trench segments are spread across multiple device layers (e.g., the first substrate 1200 of the first integrated passive device 120 and the second substrate 1220 of the second integrated passive device 122) in the thickness direction or Z dimension, a 2D projection of the 3D trench capacitor onto a horizontal or XY plane may occupy a small area. In other words, the 3D trench capacitor may have a small footprint. Further, because the capacitance of the 3D trench capacitor is a sum of the capacitances of multiple 2D trench capacitors, the 3D trench capacitor may have a high capacitance. As a result of the high capacitance and the small footprint, the 3D trench capacitor 102 may have a high capacitance density. That is to say, a capacitance per unit area in the footprint of the 3D trench capacitor may be high.

The plurality of contact pads (e.g., solder joints) 1224 are disposed between the second substrate 1220 and the package 10 and electrically connected to the plurality of through vias 1223 and the package 10. In some embodiments, the plurality of contact pads 1224 are connected between the micro bumps 14 and the through vias 1223. In this way, the second integrated passive device 122 is electrically connected to the package 10 through the plurality of micro bumps 14, and the first integrated passive device 120 is electrically connected to the package 10 through the second integrated passive device 122.

In some embodiments, the second integrated passive device 122 further includes an isolation layer 1225. The isolation layer 1225 may be disposed on the second substrate 1220 to protect elements or layers below. For example, the isolation layer 1225 is disposed on the back side SB2 of the second substrate 1220 and exposes the plurality of contact pads 1224. The isolation layers 1225 may be formed of any suitable dielectric materials such as solder mask or polyimide. However, other suitable materials are within the contemplated scope of the disclosure.

In the embodiments of the disclosure, a plurality of integrated passive devices (e.g., the first integrated passive device 120 and the second integrated passive device 122) or integrated capacitor devices are bonded together to enlarge the capacitance of the semiconductor device 12. Moreover, the integrated passive devices are bonded below the package 10. Since the integrated passive devices and the plurality of connectors 106 are located on the same side of the package 10, the greater the number of IPDs, the larger the area occupied by IPDs, and the more connectors 106 need to be removed, leading to power supply degradation. However, by electrically connecting multiple IPDs in parallel and vertically stacked the multiple IPDs below the package 10, the area occupied by the IPDs can be reduced while maintaining the capacitance, thereby reducing the number of connectors 106 that need to be removed or keeping the same footprint of the semiconductor package 1.

In some embodiments, as illustrated in FIG. 3, shapes of the first integrated passive device 120 and the second integrated passive device 122 are quadrilaterals. However, other shapes (e.g., circles, pentagons, hexagons or other polygons) are within the contemplated scope of the disclosure.

In some embodiments, as illustrated in FIG. 3, widths of sides of the first integrated passive device 120 along a direction D1 (e.g., horizontal direction) and a direction D2

(e.g., vertical direction) are X1 and Y1, respectively. In some embodiments, as illustrated in FIG. 3, widths of sides of the second integrated passive device 122 along the direction D1 and the direction D2 are X2 and Y2, respectively. In some embodiments, at least one of X1, Y1, X2, and Y2 may be larger than 0.1 mm. In some embodiments, X1 is the same as or approximate to X2, e.g., X1/X2=0.9%~1.1%. In some embodiments, Y1 is the same as or approximate to Y2, e.g., Y1/Y2=0.9%~1.1%. In some embodiments, solder joint (see contact pads 1224) is disposed to package the package 10 with the through vias 1223 to keep the same low profile (total thickness of the semiconductor package 1).

In the embodiments in which the total thickness TT of the first integrated passive device 120 and the second integrated passive device 122 is larger than 200 μm, a thickness T120 of the first integrated passive device 120 may be equal to or larger than a thickness T122 of the second integrated passive device 122 due to through vias 1223 process limitation. In the embodiments in which the total thickness TT of the first integrated passive device 120 and the second integrated passive device 122 ranges from 50 μm to 200 μm (i.e., 50 μm≤TT≤200 μm), the thickness T120 of the first integrated passive device 120 may be less than, equal to or larger than the thickness T122 of the second integrated passive device 122 based on the process flow.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes a package, a first integrated passive device, and a second integrated passive device. The first integrated passive device is disposed below the package. The second integrated passive device is disposed between the package and the first integrated passive device. The first integrated passive device is electrically connected to the package through the second integrated passive device.

In accordance with some embodiments of the disclosure, a semiconductor package includes a package, a first integrated capacitor device, and a second integrated capacitor device. The first integrated passive device is disposed below the package. The second integrated capacitor device is disposed below and electrically connected to the package. The second integrated capacitor device is bonded to the first integrated capacitor device and is electrically connected in parallel with the first integrated capacitor device.

In accordance with some embodiments of the disclosure, a semiconductor device includes a first integrated passive device and a second integrated passive device. The first integrated passive device includes a first substrate, a plurality of first deep trench capacitors, and a first redistribution layer. The plurality of first deep trench capacitors are disposed in the first substrate. The first redistribution layer is disposed on the first substrate and electrically connected to the plurality of first deep trench capacitors. The second integrated passive device is disposed on the first integrated passive device and includes a second substrate, a plurality of second deep trench capacitors, a plurality of through vias, a second redistribution layer, and a plurality of contact pads. The plurality of second deep trench capacitors and the plurality of through vias are disposed in the second substrate. The second redistribution layer is disposed between the first redistribution layer and the second substrate and electrically connected to the first redistribution layer, the plurality of second deep trench capacitors, and the plurality of through vias. The plurality of contact pads are disposed on the second substrate and electrically connected to the plurality of through vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a package;
   a first integrated passive device disposed below the package and comprises a first substrate without through substrate vias;
   a second integrated passive device disposed between the package and the first integrated passive device, wherein the first integrated passive device is electrically connected to the package through the second integrated passive device, and wherein the second integrated passive device comprises:
      a second substrate;
      a plurality of second deep trench capacitors disposed in the second substrate;
      a plurality of through vias disposed in the second substrate, wherein at least one of the plurality of through vias is located laterally between two adjacent second deep trench capacitors; and
      a plurality of second contact pads disposed on the second substrate and electrically connected to the plurality of through vias,
   wherein the package comprises a redistribution layer, an integrated circuit die disposed on the redistribution layer, a plurality of connectors laterally surrounding the first integrated passive device and the second integrated passive device and an insulating encapsulation encapsulating the integrated circuit die, the second integrated passive device and the integrated circuit die are located between the insulating encapsulation and the first integrated passive device, the redistribution layer comprises a plurality of first contact pads;
   a plurality of micro bumps bonding the plurality of second contact pads of the second integrated passive device to the plurality of first contact pads of the redistribution layer of the package; and
   an underfill disposed between the redistribution layer and the second integrated passive device and laterally surrounding the plurality of micro bumps, wherein the underfill covers sidewalls of the second integrated passive device, and the underfill is spaced apart from an interface between the first integrated passive device and the second integrated passive device and sidewalls of the first integrated passive device,
   wherein a total thickness of the first integrated passive device and the second integrated passive device is greater than 200 μm and less than a height of the plurality of connectors, the height of the plurality of connectors is less than or equal to 300um, a thickness of the second integrated passive device is less than a thickness of the first integrated passive device such that, and a thickness of the second substrate penetrated by the plurality of through vias is less than or equal to 100 μm.

2. The semiconductor package as claimed in claim 1, wherein:
the first integrated passive device further comprises:
a plurality of first deep trench capacitors disposed in the first substrate; and
a first redistribution layer disposed on the first substrate and electrically connected to the plurality of first deep trench capacitors, and
the second integrated passive device further comprises:
a second redistribution layer disposed between the first redistribution layer and the second substrate and electrically connected to the first redistribution layer, the plurality of second deep trench capacitors, and the plurality of through vias.

3. The semiconductor package as claimed in claim 2, wherein the second redistribution layer is fusion bonded to the first redistribution layer.

4. The semiconductor package as claimed in claim 2, wherein each of the plurality of through vias has a depth ranging from 5 μm to 100 μm.

5. The semiconductor package as claimed in claim 2, wherein each of the plurality of first deep trench capacitors and the plurality of second deep trench capacitors has a thickness larger than 2μm.

6. The semiconductor package as claimed in claim 1, wherein the second integrated passive device further comprises:
an isolation layer disposed on the second substrate and exposing the plurality of second contact pads.

7. The semiconductor package as claimed in claim 1, wherein a width of at least one side of each of the first integrated passive device and the second integrated passive device is larger than 0.1 mm.

8. The semiconductor package as claimed in claim 1, wherein the second integrated passive device further comprises a second redistribution layer disposed between the first redistribution layer and the second substrate and electrically connected to the first redistribution layer, the plurality of second deep trench capacitors, and the plurality of through vias, and wherein the underfill covers at least a portion of a sidewall of the second redistribution layer.

9. The semiconductor package as claimed in claim 1, wherein the height of the plurality of connectors ranges from 50 μm to 300 μm.

10. The semiconductor package as claimed in claim 1, wherein in a top view, the plurality of connectors is arranged along a first direction and a second direction, and wherein the first direction and the second direction are parallel to two adjacent sides of the first integrated passive device.

11. The semiconductor package as claimed in claim 6, wherein the underfill is disposed between the isolation layer and the plurality of first contact pads.

12. A semiconductor package, comprising:
a package; and
a first integrated capacitor device disposed below the package and comprises a first substrate without through substrate vias;
a second integrated capacitor device disposed below and electrically connected to the package, wherein the second integrated capacitor device is bonded to the first integrated capacitor device and electrically connected in parallel with the first integrated capacitor device, and wherein the second integrated capacitor device comprises:
a second substrate;
a plurality of second deep trench capacitors disposed in the second substrate;
a plurality of through vias disposed in the second substrate, wherein at least one of the plurality of through vias is located laterally between two adjacent second deep trench capacitors; and
a plurality of second contact pads disposed on the second substrate and electrically connected to the plurality of through vias,
wherein the package comprises a redistribution layer, an integrated circuit die disposed on the redistribution layer, a plurality of connectors laterally surrounding the first integrated capacitor device and the second integrated capacitor device and an insulating encapsulation encapsulating the integrated circuit die, the second integrated capacitor device and the integrated circuit die are located between the insulating encapsulation and the first integrated capacitor device, the redistribution layer comprises a plurality of first contact pads;
a plurality of micro bumps bonding the plurality of second contact pads of the second integrated capacitor device to the plurality of first contact pads of the redistribution layer of the package; and
an underfill disposed between the redistribution layer and the second integrated capacitor device and laterally surrounding the plurality of micro bumps, wherein the underfill covers sidewalls of the second integrated capacitor device, and the underfill is spaced apart from an interface between the first integrated capacitor device and the second integrated capacitor device and sidewalls of the first integrated capacitor device,
wherein a total thickness of the first integrated capacitor device and the second integrated capacitor device is greater than 200 μm and less than a height of the plurality of connectors, the height of the plurality of connectors is less than or equal to 300 μm, a thickness of the second integrated capacitor device is less than a thickness of the first integrated capacitor device such that, and a thickness of the second substrate penetrated by the plurality of through vias is less than or equal to 100 μm.

13. The semiconductor package as claimed in claim 12, wherein:
the first integrated capacitor device further comprises:
a plurality of first deep trench capacitors disposed in the first substrate; and
a first redistribution layer disposed on the first substrate and electrically connected to the plurality of first deep trench capacitors, and
the second integrated capacitor device further comprises:
a second redistribution layer disposed between the first redistribution layer and the second substrate and electrically connected to the first redistribution layer, the plurality of second deep trench capacitors, and the plurality of through vias.

14. The semiconductor package as claimed in claim 12, wherein in a top view, the plurality of connectors is arranged along a first direction and a second direction, and wherein the first direction and the second direction are parallel to two adjacent sides of the first integrated capacitor device.

15. The semiconductor package as claimed in claim 12, wherein the second integrated capacitor device further comprises:

an isolation layer disposed on the second substrate and exposing the plurality of second contact pads.

16. A semiconductor package, comprising:
a package;
a first integrated capacitor device disposed below the package and comprises a first substrate without through substrate vias;
a second integrated capacitor device disposed below and electrically connected to the package, wherein the first integrated passive device is electrically connected to the package through the second integrated passive device, and the second integrated capacitor device comprises a second substrate, a plurality of through vias penetrating the second substrate and a plurality of second contact pads disposed on the second substrate and electrically connected to the plurality of through vias,
wherein the package comprises a redistribution layer, an integrated circuit die disposed on the redistribution layer, a plurality of connectors laterally surrounding the first integrated capacitor device and the second integrated capacitor device and an insulating encapsulation encapsulating the integrated circuit die, and wherein the second integrated capacitor device and the integrated circuit die are located between the insulating encapsulation and the first integrated capacitor device, the redistribution layer comprises a plurality of first contact pads;
a plurality of micro bumps bonding the plurality of second contact pads of the second integrated capacitor device to the plurality of first contact pads of the redistribution layer of the package; and
an underfill disposed between the redistribution layer and the second integrated capacitor device and laterally surrounding the plurality of micro bumps, wherein the underfill covers sidewalls of the second integrated capacitor device, and the underfill is spaced apart from an interface between the first integrated capacitor device and the second integrated capacitor device and sidewalls of the first integrated capacitor device,
wherein a total thickness of the first integrated capacitor device and the second integrated capacitor device is greater than 200 μm and less than a height of the plurality of connectors, the height of the plurality of connectors is less than or equal to 300 μm, a thickness of the second integrated capacitor device is less than a thickness of the first integrated capacitor device, and a thickness of the second substrate penetrated by the plurality of through vias is less than or equal to 100 μm.

17. The semiconductor package as claimed in claim 16, wherein:
the first integrated capacitor device further comprises:
a plurality of first deep trench capacitors disposed in the first substrate; and
a first redistribution layer disposed on the first substrate and electrically connected to the plurality of first deep trench capacitors, and
the second integrated capacitor device comprises:
a plurality of second deep trench capacitors disposed in the second substrate; and
a second redistribution layer disposed between the first redistribution layer and the second substrate and electrically connected to the first redistribution layer, the plurality of second deep trench capacitors, and the plurality of through vias.

18. The semiconductor package as claimed in claim 17, wherein at least one of the plurality of through vias is located between two adjacent second deep trench capacitors.

19. The semiconductor package as claimed in claim 15, wherein the underfill is disposed between the isolation layer and the plurality of first contact pads.

20. The semiconductor package as claimed in claim 16, wherein the second integrated capacitor device further comprises:
an isolation layer disposed on the second substrate and exposing the plurality of second contact pads, and the underfill is disposed between the isolation layer and the plurality of first contact pads.

* * * * *